(12) United States Patent
Ness et al.

(10) Patent No.: US 11,038,431 B2
(45) Date of Patent: Jun. 15, 2021

(54) ISOLATED POWER CONVERTER FOR A THERMAL SYSTEM

(71) Applicant: WATLOW ELECTRIC MANUFACTURING COMPANY, St. Louis, MO (US)

(72) Inventors: Keith Ness, St. Louis, MO (US); Geoffrey Rozek, St. Louis, MO (US); Stanton H. Breitlow, Winona, MN (US); James Hentges, Winona, MN (US); John Lemke, St. Louis, MO (US); William Bohlinger, Winona, MN (US); Matthew Yender, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 0 days.

(21) Appl. No.: 16/868,230

(22) Filed: May 6, 2020

(65) Prior Publication Data
US 2020/0266715 A1 Aug. 20, 2020

Related U.S. Application Data (63) Continuation-in-part of application No. 16/100,585, filed on Aug. 10, 2018, and a continuation-in-part of application No. 15/624,060, filed on Jun. 15, 2017, now Pat. No. 10,690,705.

(60) Provisional application No. 62/543,457, filed on Aug. 10, 2017, provisional application No. 62/350,275, filed on Jun. 15, 2016.

(51) Int. Cl.
*H04B 1/02* (2006.01)
*H02M 3/335* (2006.01)
*H02M 1/44* (2007.01)
*H02M 7/219* (2006.01)
*H05B 3/00* (2006.01)
*G01R 19/165* (2006.01)
(Continued)

(52) U.S. Cl.
CPC .. *H02M 3/33576* (2013.01); *G01R 19/16528* (2013.01); *H02M 1/44* (2013.01); *H02M 7/219* (2013.01); *H05B 1/023* (2013.01); *H05B 3/0019* (2013.01); *H02M 2001/0006* (2013.01); *H02M 2001/0009* (2013.01); *H05B 2203/035* (2013.01)

(58) Field of Classification Search
CPC ...... H02M 3/3376; H02M 1/44; H02M 7/219; H02M 2001/0009; G01R 19/6528; H05B 1/02; H05B 3/0019; H05B 2203/035; H05B 1/023
USPC .......... 219/204, 202, 494, 497, 502, 121.54, 219/121.39
See application file for complete search history.

(56) References Cited

U.S. PATENT DOCUMENTS 7,813,148 B2 * 10/2010 Zeng .................... H02M 3/3376
                                                                363/17
8,816,533 B2 *  8/2014 Navarro .................. H02J 9/062
                                                                307/64

(Continued)

*Primary Examiner* — Mark H Paschall
(74) *Attorney, Agent, or Firm* — Burris Law, PLLC (57) ABSTRACT

A power converter system provides adjustable power to a heater and includes an input rectifier and a full-bridge isolating converter. The input rectifier is configured to rectify a line power having a line energy. The full-bridge isolating converter configured to generate an isolated output voltage based on the rectified line power. The isolated output voltage is electrically isolated from the line energy.

17 Claims, 5 Drawing Sheets

(51) Int. Cl.
*H05B 1/02* (2006.01)
*H02M 1/00* (2006.01)

(56) References Cited

U.S. PATENT DOCUMENTS

| | | | |
|---|---|---|---|
| 10,615,633 B2* | 4/2020 | Paatero | H02J 9/00 |
| 10,690,705 B2* | 6/2020 | Breitlow | G01R 19/257 |
| 10,707,747 B2* | 7/2020 | Davidson | H02M 3/33569 |
| 2012/0205982 A1* | 8/2012 | Navarro | H02J 9/061 |
| | | | 307/66 |

* cited by examiner

ISOLATED POWER CONVERTER FOR A THERMAL SYSTEM

CROSS-REFERENCE TO RELATED APPLICATIONS

This application is a continuation-in-part application of U.S. Ser. No. 16/100,585, filed Aug. 10, 2018, which claims the benefit of and priority to U.S. Provisional Application No. 62/543,457, filed Aug. 10, 2017, and is a continuation-in-part application of U.S. Ser. No. 15/624,060, filed Jun. 15, 2017, which claims benefit of U.S. Provisional Application No. 62/350,275, filed Jun. 15, 2016. The content of the above applications are incorporated herein by reference in their entirety.

FIELD

The present disclosure relates to a power device for a thermal system.

BACKGROUND

The statements in this section merely provide background information related to the present disclosure and may not constitute prior art.

An electric heater operable to heat a load at a range of temperatures is typically powered by a power control device that provides adjustable power to the heater. Some power control devices use phase angle control (i.e., phase-fired control) to limit power from a power supply by modulating a power switch, such as a thyristor or triac, at a predetermined phase. In another example, the power control device can be a variable direct current (DC) power source that converts alternating current (AC) power into DC power. While specific examples are provided, other power control devices may also be used.

The above described power control devices can have poor harmonics and reduced power factor that can require additional components for compensating for the power factor. In addition, for phase angle control, it can be difficult to limit voltage to the heater when the power setpoint is above 50%. And, a variable DC power source can require significant number of electronic components, such as bulk capacitors, electromagnetic interference (EMI) filters, high frequency transformers, multiple rectifiers, and/or DC/DC converters, all of which add to the complexity and size of the device.

These and other issues related to providing adjustable and controllable power to heaters are addressed by the present disclosure.

SUMMARY

This section provides a general summary of the disclosure and is not a comprehensive disclosure of its full scope or all of its features.

The present disclosure is directed toward a power converter system for providing adjustable power to a heater. The power converter system includes an input rectifier configured to rectify a line power having a line energy, and a full-bridge isolating converter configured to generate an isolated output voltage based on the rectified line power. The isolated output voltage is electrically isolated from the line energy.

In one form, the full-bridge isolating converter further includes a full-bridge rectifier, a transformer electrically coupled to the full-bridge rectifier, where the transformer is configured to generate an isolated full-wave voltage, and an output rectifier configured to rectify the isolated full-wave voltage to generate the isolated output voltage.

In another form variation, the full-bridge rectifier includes a first pair of electronic switches and a second pair of electronic switches to drive the transformer with the rectified line power. In another variation, the power converter system includes a power controller configured to operate the full-bridge rectifier to generate the isolated output voltage.

In another form, the power controller is configured to perform a variable frequency control to generate an output voltage that is less than or equal to a voltage limited power setpoint as the isolated output voltage.

In yet another form, the power converter system further includes a bridge sensor configured to detect an electric current through a primary winding of the transformer to detect flux walk.

In one form, the power converter system includes a filter configured to filter the isolated output voltage to output a desired output voltage.

In another form, the input rectifier is configured to receive, as the line power, one of a single-phase alternating current (AC) or a direct current (DC).

In one form, the present disclosure is directed toward a control system that includes the power converter system described herein and a primary system controller configured to determine a desired output voltage and control the power converter system to generate the desired output voltage.

In one form, the present disclosure is directed toward a method of converting power to operate a load being supplied by line power having a line energy. The method includes rectifying the line power, switchably driving a transformer with the rectified line power to generate an adjustable electrically isolated full-wave voltage; and rectifying the electrically isolated full-wave voltage to obtain an isolated output voltage that is indicative of a desired output voltage applied to the load, where current is drawn from the line power in phase with the isolated output voltage.

In another form, the method further includes filtering the isolated output voltage to obtain the desired output voltage.

In yet another form, the method further includes performing a variable frequency control when the desired output voltage is less than a voltage limited power setpoint to drive the transformer at a switching frequency less than that of when the desired output voltage is greater than the voltage limited power setpoint.

In one form, the method further includes detecting an electric current through a primary winding of the transformer, and performing a corrective action when the electric current is greater than a flux current threshold.

In another form, the method further includes detecting a applied voltage, where the applied voltage is at least one of the line power or the rectified line power, and performing a corrective action when the applied voltage exceeds a predefined voltage range.

In yet another form, the line power is one of a single-phase alternating current (AC) or a direct current (DC).

In one form, switchably driving the transformer further includes alternatingly driving a first pair of electronic switches and a second pair of electronic switches. The first pair of electronic switches and the second pair of electronic switches form a full-bridge rectifier.

In one form, the present disclosure is directed toward a power converter system for providing a desired output voltage to a heater. The power converter system includes an input rectifier configured to rectify a line power having a line energy, a transformer configured to generate an isolated full-wave voltage, a full-bridge rectifier electrically coupled to the transformer and operable to drive the transformer to generate the isolated full-wave voltage based on the rectified line power, an output rectifier configured to rectify the isolated full-wave voltage to generate an isolated output voltage indicative of the desired output voltage, a bridge sensor configured to measure a bridge current flowing through the transformer, and a power controller configured to operate the full-bridge rectifier to drive the transformer.

In another form, the power controller is configured to determine a flux walk state in response to the bridge current being greater than or equal to a flux current threshold, and the power controller is configured to perform a corrective action in response to the flux walk state.

In yet another form, the power converter system further includes a filter configured to filter the isolated output voltage to output the desired output voltage.

In another form, the input rectifier is configured to receive, as the line power, one of a single-phase alternating current (AC) or a direct current (DC).

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

A thermal system may include a heater having one or more heating elements and a control system that includes a controller and a power converter system (i.e., power control device) to independently control the power to the heating elements of the heater. In one form, the power converter system includes buck converters that are operable by the controller to generate a desired output voltage to the heating elements of the heater.

In another form, the control system includes a power converter system that provides an isolation barrier between the power source and the power converter(s) to isolate the heater from the power source. More particularly, the present disclosure describes a power converter system that includes an isolation circuit, which may be referred to as an isolated power converter, that isolates and converts line power from a power source to an adjustable desired output voltage that can be applied to a load, such as a heater. The isolated power converter includes a full-bridge isolating converter having high switching rate electronic switches and a transformer for isolating and converting the line power to a desired voltage. The isolated power converter reduces or inhibits loss in power during the conversion and eliminates or reduces the use a large bulk capacitor (i.e., DC link capacitors). Accordingly, the isolated power converter may be smaller than, for example, a variable DC power source.

Figure 1:
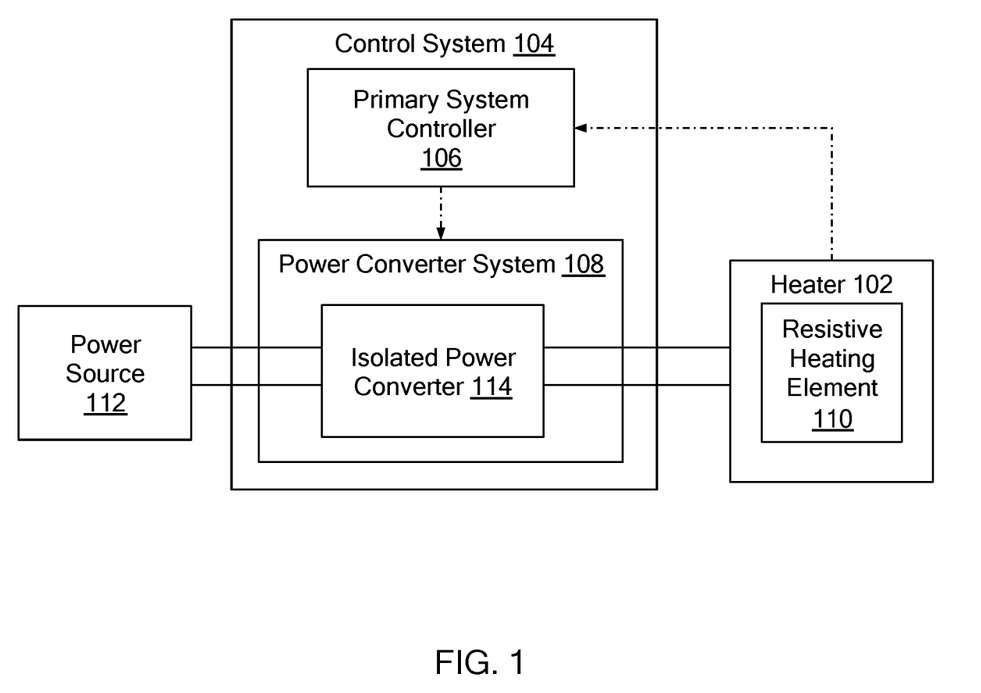
FIG. 1 is a block diagram of a thermal system including a heater and a control system having an isolated power converter in accordance with the present disclosure.

Referring to FIG. 1, a thermal system 100 constructed in accordance with the present disclosure includes a heater 102 and a control system 104 for operating the heater 102. The control system 104 is configured to provide an isolated adjustable power output to the heater 102 based on, for example, a power setpoint, a temperature setpoint, and/or feedback data from the heater 102, among other variables. In one form, the control system 104 includes a primary system controller 106 for determining the amount of power to be applied to the heater 102 and a power converter system 108 operable by the primary system controller 106 for generating the isolated power output. In the figures, dashed-dot arrows represent data and/or control signals (e.g., 0V-5V) and solid lines represent power lines.

The heater 102 is operable to heat a load such as but not limited to a wafer as part of a semiconductor processing chamber, gaseous fluid flowing in a channel/pipe, and/or liquid provided in a container. In one form, the heater 102 includes a resistive heating element 110 that generates heat when power is applied to the resistive heating element 110. While one resistive heating element is provided, the heater 102 may include more than one resistive heating element.

In one application, along with generating heat, the resistive heating element 110 may operate as a sensor for measuring an average temperature of the resistive heating element 110 based on a resistance of the resistive heating element 110. More particularly, such a resistive heating element generally has a non-linear temperature coefficient of resistance and defines a "two-wire" heater system. Such a two-wire system is disclosed in U.S. Pat. No. 7,196,295, which is commonly owned with the present application and the contents of which are incorporated herein by reference in its entirety. In a two-wire system, the thermal system is an adaptive thermal system that merges heater designs with controls that incorporate power, resistance, voltage, and current in a customizable feedback control system that limits one or more these parameters (i.e., power, resistance, voltage, and current) while controlling another. The control system 104 is configured to monitor at least one of current, voltage, and power delivered to the resistive heating element to determine resistance, and thus, temperature of the resistive heating element 110.

In another exemplary application, the heater 102 is configured to include temperature sensing power pins for measuring a temperature of the heater 102. Using the power pins as a thermocouple to measure a temperature of a resistive heating element is disclosed in Applicant's co-pending application, U.S. Ser. No. 14/725,537, filed May 29, 2015 and titled "RESISTIVE HEATER WITH TEMPERATURE SENSING POWER PINS," which is commonly owned with the present application and the contents of which are incorporated herein by reference in its entirety. Generally, the resistive heating element of the heater and the control system are connected via a first power pin and a second power pin which define a first junction and a second junction, respectively. The first and second power pins function as thermocouple sensing pins for measuring temperature of the resistive heating element of the heater 102. The control system 104, which is in communication with the first and second power pins, is configured to measure changes in voltage at the first and second junctions. More specifically, the control system 104 measures millivolt (mV) changes at the junctions and then uses these changes in voltage to calculate an average temperature of the resistive heating element 110. In one form, the control system 104 may measure changes in voltage at the junctions without interrupting power to the resistive heating element.

While specific examples and operational functions are described, the heater 102 may be other suitable types of heaters that are operational to generate varying temperature based on power being received. In addition, in lieu of or in addition to the "two-wire" type heater or the temperature sensing power pins, the heater 102 may include a discrete temperature sensor such as a thermocouple, a resistance temperature detector (RTD) sensors, among others, for measuring the temperature of the heater 102, which is provided to the control system 104 as part of a closed-loop control.

The control system 104 is configured to control the power to the heater 102 and thus, the thermal performance of the heater 102 based on operation setpoints, feedback data from the heater 102, and/or predefined control programs/algorithms, among other inputs and/or control schemes. More particularly, in one form, the primary system controller 106 determines a desired output voltage for the heater 102 and the power converter system 108 converts an input voltage (i.e., a line power) from a power source 112 to the desired output voltage. In one form, the desired output voltage may be a value between 0V to a maximum voltage that is equal to or greater than the line voltage (e.g., maximum voltage is line voltage, 10% greater than line voltage, or other suitable value based on system criteria).

The primary system controller 106 may be configured in various suitable ways based on the application and the type of heater 102. For example, in one form, the primary system controller 106 is a closed-loop system that acquires feedback data from the heater 102 and/or sensors (not shown) provided with the heater 102 to monitor performance characteristics of the heater 102 such as but not limited to: voltage applied, electric current, resistance, power, and/or temperature. Based on the performance characteristics and defined control schemes, the primary system controller 106 determines the desired output voltage and the corresponding control signals to be transmitted to the power converter system 108 for generating the desired output voltage. In addition to feedback data regarding the performance characteristics of the heater 102, the primary system controller 106 may receive other data indicative of the operation of the thermal system 100, which can be used to control the power to the heater 102. For example, data indicative of the power from the power source 112 may be monitored to detect power drops or spikes.

In one form, the primary system controller 106 uses a state mode control in which the primary system controller 106 determines an operational state of the heater 102 based on one or more input parameters (e.g., temperature, resistance, current, and/or voltage). The operational state of the heater 102 includes: idle mode in which no power is being supplied to the heater 102; start-up mode in which low power is being supplied to measure voltage and current; soft-start mode in which the power is increased at a low ramp rate until a specific resistance set point is passed; rate mode in which the temperature is increased at a ramp rate selected based on a material of the heater; hold mode in which temperature of the heater 102 is controlled to a specific set point using, for example, a continuous proportional-integral-derivative controller (PID control). These operation states are merely exemplary and could include other modes while remaining within the scope of the present disclosure.

Based on the operational mode of the heater 102, the primary system controller 106 independently controls the heating elements by adjusting the input voltage applied to the heating elements from a respective isolated power converter. The primary system controller 106 can be configured in various ways to adjust the input voltage including but not limited to: (1) modifying PID parameters according to the operational state; (2) changing a mode that is automatic (no user input) to manual (user inputs received by controller) or changing a mode that is manual to automatic; (3) setting a manual percent power; (4) starting a set point ramp; (5) modifying an integral (holding term) of the PID control by offsetting the integral, scaling the integral, and/or making the modification based on temperature; and (6) changing voltage when a new operation state is entered. The logic used by the primary system controller 106 for adjusting the voltage can be triggered in various suitable ways including but not limited to: (1) detecting start-up; (2) proximity of a process temperature to a set point; (3) deviation of the process temperature from the set point; (4) change in the set point; (5) exceeding the process temperature; (6) falling below the process temperature; (7) lapse of a predetermined time period; (8) a general system reading to be reached (e.g., current, voltage, wattage, resistance, and/or percent of power). The thermal system includes multiple states, where each state has unique settings to create a programmable state machine providing optimum performance in a dynamic system. Each state may define the next state that is entered when the condition is met.

The primary system controller 106 may also be configured to perform other operations such as but not limited to: a cold ping control to provide a small signal level (e.g., 5V) to the heater 102 to determine characteristics of the thermal system like temperature; reporting voltage, current, resistive, and/or wattage via a graphical user interface; calibration control to learn characteristics such as a heater-load temperature correlation; diagnostics to monitor the health and/or state of the heater 102; and/or system protection monitoring.

More particularly, in one form, the primary system controller 106 is configured to monitor the thermal system 100 for abnormal activity that may damage the heater 102 and/or control system 104. In one form, the primary system controller 106 performs at least one of the following protection protocols: zone-to-zone monitoring; zone-to-reference monitoring; rate of change gauge, and/or energy limit control.

The zone-to-zone and zone-to-reference monitoring are examples of coherence control to assess whether the thermal system 100 is maintaining a desired equilibrium along the heater 102 and to minimize or inhibit damage to the heater 102, such as ceramic breakage. For example, for the zoneto-zone monitoring, the primary system controller 106 determines the temperature of the heating zones 114 based on the input parameters, and determines whether the difference in temperature between adjacent zones exceed a temperature variance threshold (e.g., 10° C. difference). If so, the primary system controller 106 performs a protective measure to reduce or inhibit damage to the thermal system 100.

The zone-to-reference monitoring compares the average temperature of the heater 102 with the reference temperature to determine if the temperature between the two exceeds a temperature variance threshold, which may be the same as or different from the one used for zone-to-zone monitoring. Accordingly, the coherence control can prevent the thermal system 100 from exceeding variance threshold by, for example, adjusting power to the heater 102 or shutting down the system.

Another indicator for possible abnormal operation of the thermal system 100 is in the rate at which the heater 102 is heating based on the power being applied. Specifically, in one form, the rate at which the heater temperature and/or electrical response of heater 102 changes based on the power being applied is compared to an associated rate range threshold to determine whether the heater 102 is responding within specification. For example, if the heater temperature is not increasing when the power applied increases or if the heater temperature suddenly increases when the power applied is the same or slightly increases, the primary system controller 106 flags such activity as being abnormal and performs a protective measure. Similarly, the energy limiting control sets a limitation on the amount of power that can be applied to the heater 102, and the primary system controller 106 outputs a protective measure if the thermal system 100 exceeds and/or approach those limits. For example, the energy limiting control is used to set the maximum current during low resistance startup, and the maximum power delivered. The maximums can be set by the user or is predetermined based on the specification of, for example, the heater 102, and can vary over a temperature range.

The protective measure performed by the primary system controller 106 includes, but is not limited to: reducing power to one or more heating zones 114 to control the variation, shut-off power to the heater 102, and/or output a message to the computing device regarding the significant temperature variance.

Figure 2:
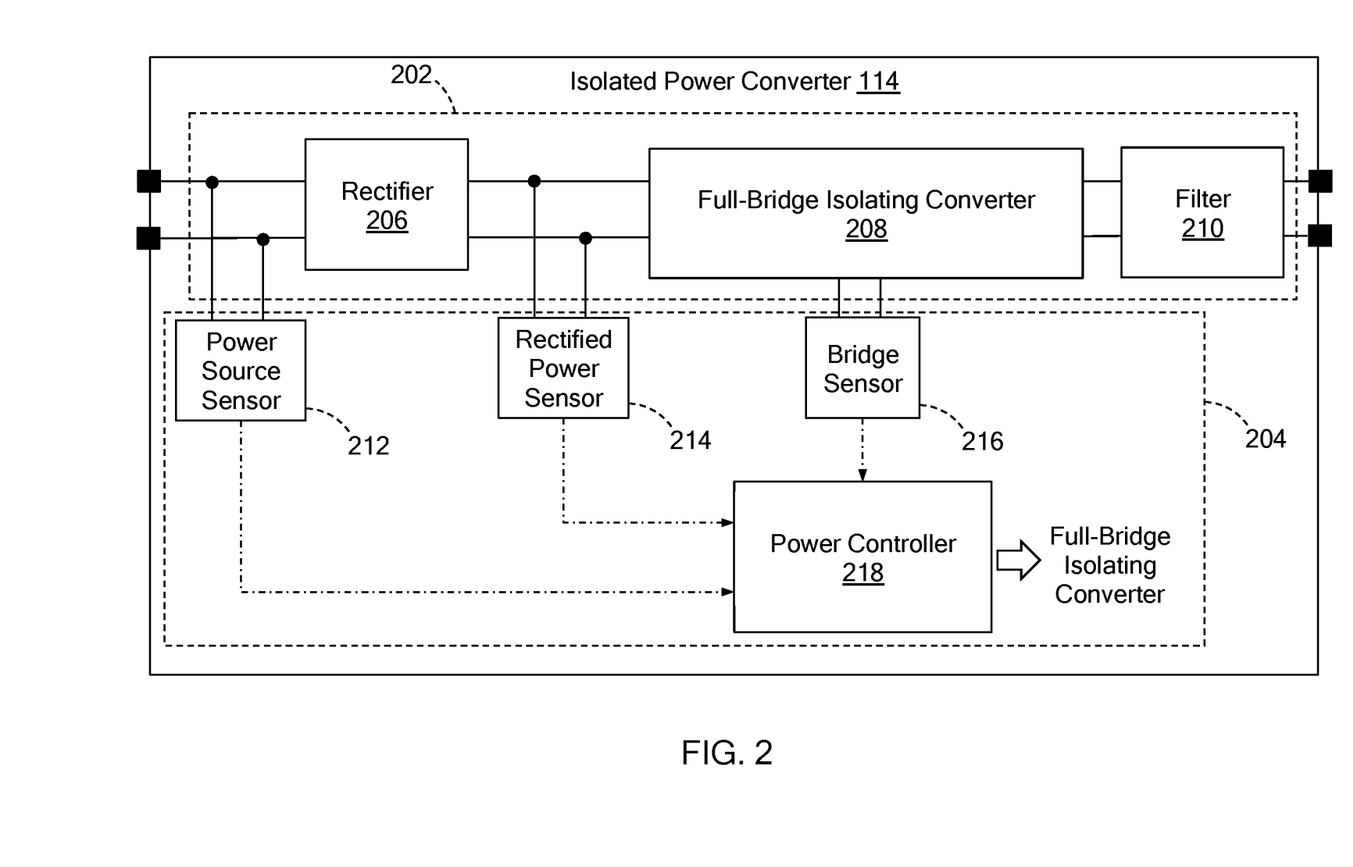
FIG. 2 is a block diagram of the isolated power converter of FIG. 1 in accordance with the present disclosure.

In one form, the power converter system 108 includes an isolated power converter 114 that is a step-down voltage converter for generating an isolated desired output voltage. Referring to FIG. 2, in one form, the isolated power converter 114 includes a power conversion portion 202 for converting the input voltage to the desired output voltage determined by the primary system controller 106 and a control portion 204 for controlling the power conversion portion 202 to generate the desired output voltage.

In one form, the power conversion portion 202 includes a rectifier 206, a full-bridge isolating converter 208, and a filter 210. The rectifier 206 is configured to receive the input voltage (i.e., line power) from the power source 112 and generate a rectified voltage signal (i.e., rectified line power) that flows in one direction. For example, with the input voltage being a single-phase AC power signal, the rectifier 206 outputs a rectified AC signal that is provided in one direction. The input voltage may also be a direct current (DC) voltage signal and is not limited to an AC power signal. The rectifier 206 may be an active or a passive rectifier.

Based on the rectified voltage signal, the full-bridge isolating converter 208 generates an isolated output voltage signal that is indicative of the desired output voltage. As described herein, the full-bridge isolating converter 208 includes a plurality of electronic switches that are operable by the control portion 204 to adjust the voltage received to the desired output voltage. The filter 210 smooths the isolated output voltage signal to output the desired output voltage to the heater 102.

The control portion 204 is configured to monitor the performance of the power conversion portion 202 and communicate with the primary system controller 106. In one form, the control portion 204 includes a power source sensor 212, a rectified power sensor 214, a bridge sensor 216, and a power controller 218 that is in communication with the sensors 212, 214, and 216. The power source sensor 212 and the rectified power sensor 214 detect voltage level of an input voltage from the power source sensor 212 and a rectified voltage (i.e., rectified line power) from the rectifier 206, respectively. In one form, the power source sensor 212 and the rectified power sensor 214 are voltage sensors and include the requisite circuitry for measuring the voltage from the power source 112 and the rectifier 206, respectively. While the control portion 204 is provided as including both the power source sensor 212 and the rectified power sensor 214, the control portion 204 may only include one of the power source sensor 212 or the rectified power sensor 214.

The bridge sensor 216 is configured to measure a bridge current through the full-bridge isolating converter 208 to monitor an inductor flux walk condition of the full-bridge isolating converter 208. In one form, the bridge sensor 216 is a current sensor and includes the requisite circuitry for measuring the current at the full-bridge isolating converter 208 as described further herein.

The power controller 218 is communicably coupled to the primary system controller 106 and is configured to control the operation of the full-bridge isolating converter 208 to generate a voltage signal indicative of the desired output voltage. In addition, based on data from the power source sensor 212 and/or the rectified power sensor 214, the power controller 218 is configured to monitor the voltage being provided to the full-bridge isolating converter 208 to detect abnormal voltage levels. In particular, if the voltage level surges above or decreases below predefined thresholds, the power controller 218 stops operation of the full-bridge isolating converter 208 to prevent or inhibit power surge/drop at the heater 102. For example, the power source sensor 212 and/or the rectified power sensor 214 detect an applied voltage (e.g., the line power or the rectified line power) entering the full-bridge isolating converter 208, and the power controller 218 is configured to perform a corrective action when the applied voltage exceeds a predefined voltage range. In one form, during such abnormal power activity, the power controller 218 is also configured to notify the primary system controller 106 of such abnormal activity and/or turn-off power to the heater 102, as a corrective action.

Figure 3:
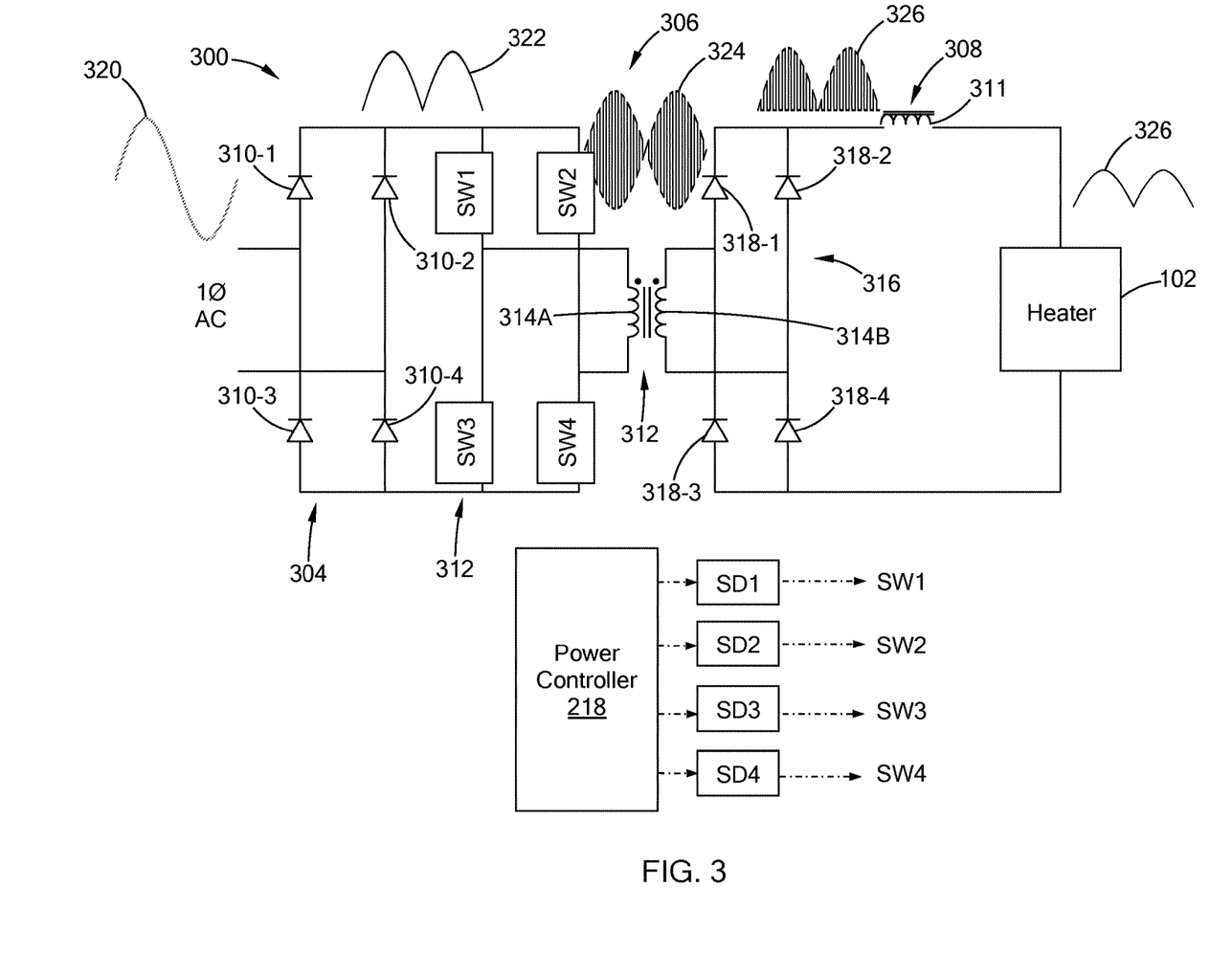
FIG. 3 is an example circuit diagram of an isolated power converter in accordance with the present disclosure.

Rereferring to FIG. 3, an example circuit diagram of a power conversion portion 300 with the power controller 218 for the isolated power converter 114 is provided. The power conversion portion 300 can be provided as the power conversion portion 202. For purposes of brevity, other components illustrated with the isolated power converter 114 are not depicted in FIG. 3, such as the sensors 212, 214, and 216.

The power conversion portion 300 includes a rectifier 304, a full-bridge isolating converter 306, and a filter 308. The rectifier 304, the full-bridge isolating converter 306, and the filter 308 can be provided as the rectifier 206, the full-bridge isolating converter 208, and the filter 210, respectively. The rectifier 304 is a passive rectifier having four diodes 310-1 to 310-4 (collectively "diodes 310"). In lieu of diodes 310, the rectifier 304 may be an active rectifier having switches such as field-effect transistors (FETs) or bipolar junction transistors (BJTs) that would be operable by the power controller 218. In one form, the filter 308 includes an inductor 311 that smooths the voltage signal from the full-bridge isolating converter 306 and outputs the desired output voltage signal to the heater 102. The filter 308 may be other suitable filters such as a capacitor-inductor filter and is not limited to the inductor 311.

The full-bridge isolating converter 306 is configured to generate an isolated voltage signal (i.e., isolated output voltage) that is indicative of the desired output voltage to be applied to the heater 102. In one form, the full-bridge isolating converter 306 includes a full-bridge rectifier 312, a transformer 314, and an output rectifier 316. The full-bridge rectifier 312 is electrically coupled to the rectifier 304 and is operable to drive the transformer 314 with the rectified voltage signal (i.e., rectified line power). In one form, the full-bridge rectifier 312 includes a first pair of electronic switches formed by SW1 and SW4, a second pair of electronic switches formed by SW2 and SW3, and switch drivers SD1, SD2, SD3, and SD4 for driving the switches SW1, SW2, SW3, and SW4, respectively. In one form, the switches SW1, SW2, SW3, and SW4 may be field-effect transistors (FETs) or bipolar junction transistors (BJTs), and the switch drivers SD1, SD2, SD3, and SD4 are electronic components for operating the transistors. Each of the switch drivers SD1, SD2, SD3, and SD4 is electrically coupled to and operable by the power controller 218 to open and close the electronic switches SW1, SW2, SW3, and SW4. In the following, the switches SW1, SW2, SW3, and SW4 may collectively be referenced as switches SW1-SW4 and the switch drivers SD1, SD2, SD3, and SD4 may collectively be referenced as switched drivers SD1-SD4.

The transformer 314 is provided between the full-bridge rectifier 312 and the output rectifier 316 to provide galvanic isolation between the power source 112 and the heater 102. Here, a primary winding 314A of the transformer 314 is coupled to the full-bridge rectifier 312 and a secondary winding 314B of the transformer 314 is coupled to the output rectifier 316. The transformer 314 is configured to have a 1:1 turn ratio, but may have a 1:X turns ratio, where X is greater than 1 (e.g., 1:1.2 turn ratio), to increase voltage of the isolated voltage signal.

In one form, the output rectifier 316 is a passive rectifier having four diodes 318-1 to 318-4 (collectively "diodes 318"). The output rectifier 316 rectifies an isolated full-wave voltage from the transformer 314 to generate a rectified isolated voltage that may also be referred to as an isolated output voltage and that is indicative of the desired output voltage. Like the rectifier 304, the output rectifier 316 may be an active rectifier controllable by the power controller 218 instead of a passive rectifier.

The power controller 218 is configured to operate the full-bridge rectifier 312 to generate the desired output voltage based on power instructions from the primary system controller 106 that indicates the amount of power to be provided to the heater 102 (e.g., 80% of input voltage, 75% of input voltage, etc). Based on the power instructions, the power controller 218 determines the duty cycle for operating the switches SW1-SW4. The power controller 218 operates the first pair of switches SW1 and SW4 together and the second pair of switches SW2 and SW3 together to drive the transformer 314 in different directions. That is, with switches SW1 and SW4 closed and switches SW2 and SW3 open, the rectified power is applied to the transformer 314 such that electric current flows through the primary winding 314A in a first direction. With switches SW1 and SW4 open and the switches SW2 and SW3 closed, the rectified power is applied to the transformer 314 such that electric current flows through the primary winding 314A in a second direction opposite the first direction. The amount of voltage generated is dependent, not only the turn ratio of the transformer 314, but on the rate at which the switches SW1-SW4 are actuated. That is, assuming the turn ratio of the transformer is 1:1, if the switches are at a 100% duty cycle, the desired output voltage would be the same or substantially the same as the input voltage and duty cycles less than 100% provide a desired output voltage less than the input voltage. It should be appreciated by one skilled in the art, that the output voltage at, for example, 100% duty cycle may be greater than the input voltage if the transformer 314 is configured as a step-up transformer.

With continuing reference to FIG. 3, to illustrate the power conversion operation of the isolated power converter, the power conversion portion 300 receives a single-phase AC signal 320. The rectifier 304 generates a rectified AC signal 322 which is received by the full-bridge isolating converter 306. Based on the power instructions from the primary system controller 106, the power controller 218 determines the duty cycle for the switches SW1-SW4 and operates the switches SW1-SW4. Accordingly, the full-bridge rectifier 312 is operated to drive the transformer 314 in different directions to generate an isolated full-wave voltage signal 324. The isolated full-wave voltage signal 324 is defined by a plurality of pulsed signals indicative of the rectified AC signal 322 being applied to the transformer 314 by the activation and deactivation of the first pair of switches SW1 and SW4 and the second pair of switches SW2 and SW3. The output rectifier 316 rectifies the isolated full-wave voltage signal 324 to provide an isolated rectified voltage signal 326 that is indicative of the desired output voltage. The filter 308 smooths the isolated rectified voltage signal 326 to provide an output voltage signal 328 as the desired output voltage, which is applied to the heater 102. While the input voltage is provided as a single-phase AC signal 320, the input voltage may be provided as any other suitable voltage signal such as a two legs of a three-phase signal, a DC signal, among others.

Figure 4:
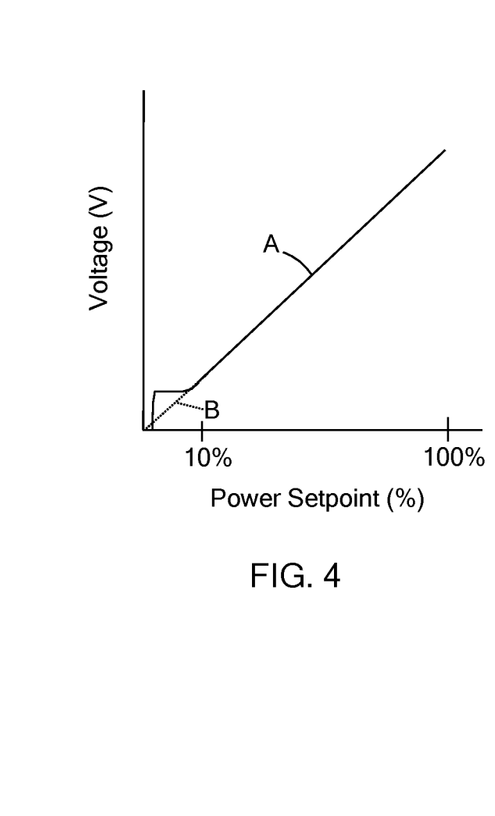
FIG. 4 is a graph comparing output voltage of the isolated power converter with and without variable frequency control at low power setpoints in accordance with the present disclosure.

Since the switching rate of the full-bridge rectifier 312 is finite, the output voltage may undergo a step or a voltage drop when transitioning to a voltage level below a defined power setpoint. For example, FIG. 4 illustrates a graph of output voltages of the isolated power converter 114 versus power setpoints. As illustrated by solid line A, the relationship is substantially linear until a low limit power setpoint, which is at about 10% in the example. When the power setpoint is less than 10%, the relationship is no longer linear, and the output voltage stays constant and then drops.

Figure 5:
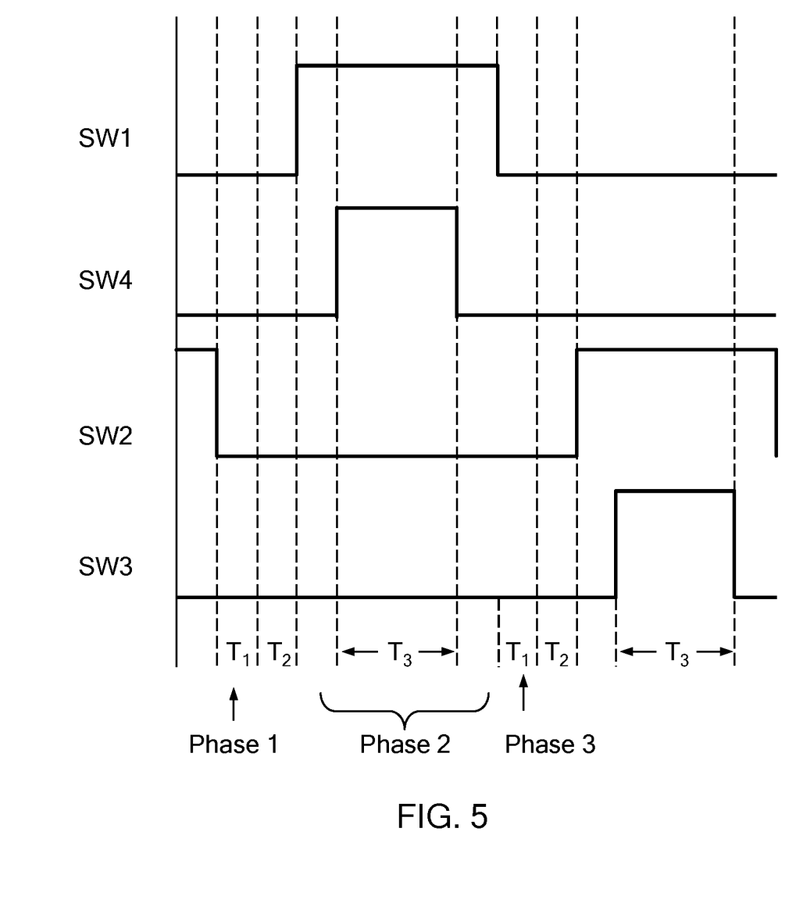
FIG. 5 is a graph illustrating variable frequency control of the isolated power converter in accordance with the present disclosure.
Figure 6:
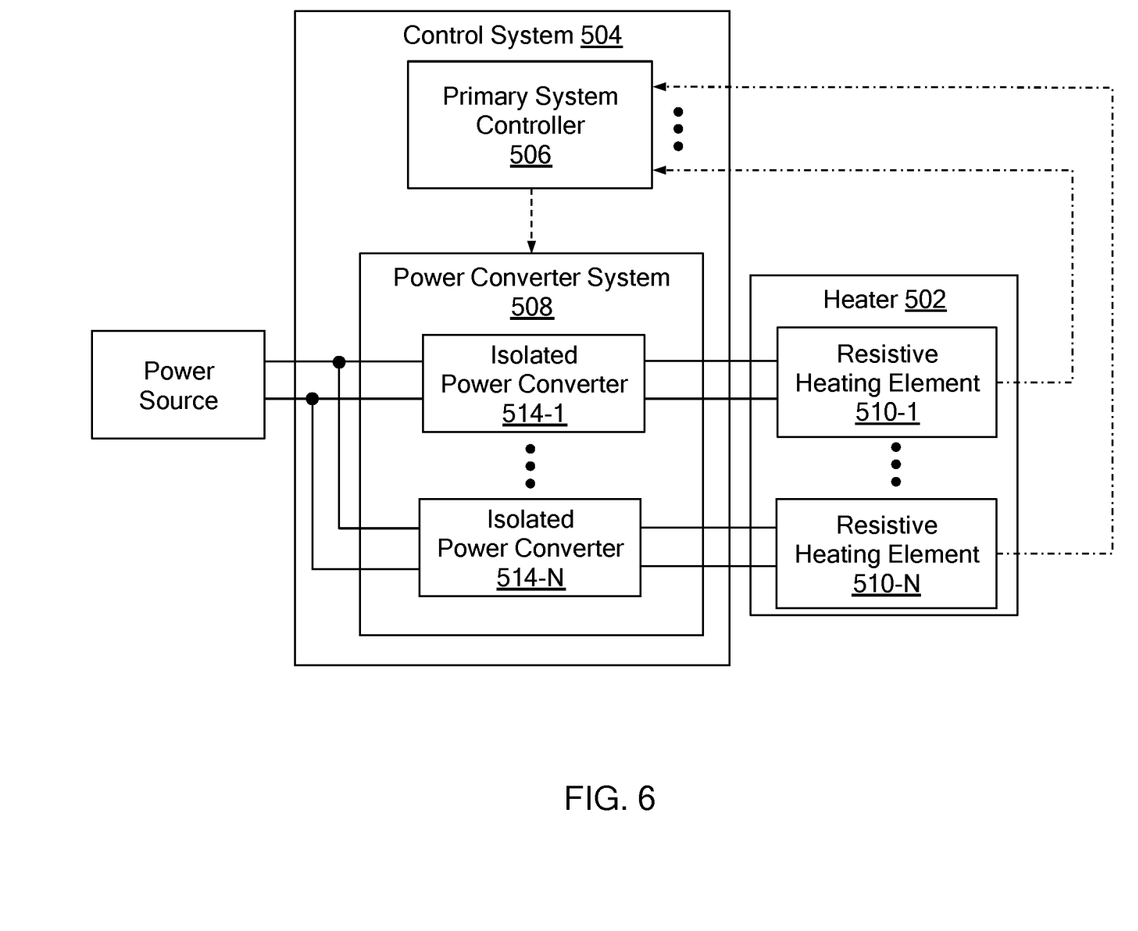
FIG. 6 is block diagram of a thermal system having multiple isolated power converters in accordance with the present disclosure.

To provide lower output voltages, the power controller 218 is configured to perform a variable frequency control of the full-bridge rectifier 312. Referring to FIG. 5, an exemplary three phase variable frequency control is provided in which: "T1" represents a first time variable for changing frequency from a standard operating frequency to reduced frequency levels during Phase 1 and Phase 3; "T2" represents a second time variable that is a predefined wait time provided between each phase; and "T3" represents a third time variable for changing pulse width of the switches from a standard pulse period (e.g., 5 µs) to a variable pulse period (0.5 µs).

In Phase 1 of the variable frequency control, the switches SW1-SW4 are open and the switching frequency is reduced from the standard operating frequency (e.g., 120 kHz) to a first frequency level (e.g., 20 kHz). Accordingly, for Phase 1, T1 is provided as the time for reducing the switching frequency to the first frequency level) (i.e., starts at 0 and increases until the switching frequency is the first frequency level). Before initiating Phase 2, the variable frequency control waits for the predefined wait time (i.e., T2), and then begins to reduce a pulse period for the switches SW1-SW4 from the standard pulse period to the variable pulse period (T3). For example, in one form, the first pair of switches SW1 and SW4 are closed (i.e., driven to allow current to flow through the transformer) with switch SW1 initially having the standard pulse period and the pulse period of the switch SW4 being reduced to a variable pulse period (T3). Once switch SW4 is at the variable pulse period, the pulse period of the switch SW1 is reduced. The same control occurs with the second pair of switches SW2 and SW3 during its switching cycle. It would be apparent to one skilled in the art that the adjustment of the pulse period occurs over time (i.e., multiple switching cycles) and that FIG. 5 is not a complete representation of that time period. In another form, in lieu of changing the pulse period of each of the switches SW1 to SW4, the pulse period may be adjusted for one switch among the pair of switches. In another form, in lieu of controlling the pulse period of switches SW4 and SW3, the variable frequency control may reduce the pulse period of switches SW1 and SW2.

With the pulse period set to T3 and the switches SW1 to SW4 being open, such as between switching operation of the pair of switches, the first variable time T1 is extended to reduce the switching frequency from the first frequency level to a second frequency level during Phase 3. For example, the switching frequency is reduced from 20 kHz to 2 kHz. Accordingly, the time between switching cycles is extended. In one form, to return to the standard operating frequency and standard pulse period, the variable frequency control may be performed in reverse. That is, the switching frequency is increased from the second frequency level to the first frequency level, the pulse period is increased from the variable pulse period to the standard pulse period, and the switching frequency is increased from the first frequency level to the standard frequency level. It should be readily understood that the numerical values provided for the various variables of the variable frequency control such as the standard operating frequency, the first frequency level, the second frequency level, and the pulse width, are for explanation purposes only and other suitable values may be defined.

Using the variable frequency control, control of the output voltage is improved, as represented by dotted line B in FIG. 4, than line A. Accordingly, the isolated power converter may generate a desired output voltage less than the voltage limited power setpoint, such as 10% of line power, and inhibit voltage drops when operating at low limit power setpoints. In one form, the variable frequency control may be provided as an algorithm executed by the power controller 218 for controlling the switches SW1-SW4 at power setpoints at or below the low limit power setpoint. It should be readily understood that the specific values illustrated in FIG. 4 are for explanation purposes only and should not limit the scope of the present disclosure.

In one form, the power controller 218 is configured to monitor occurrence of a flux walk state of the transformer 314, which can be caused by buildup of voltage in the primary winding 314A, and perform a corrective action to inhibit or reduce damage to the heater 102. Specifically, the bridge sensor 216 measures the bridge current flowing through the primary winding 314A, and if the bridge current is greater than or equal to a flux current threshold, the power controller 218 is configured to perform a corrective action in response to the flux walk state. In one form, for a first occurrence of the flux walk state, the power controller 218, as the corrective action, opens the switches SW1-SW4 to shutoff power to the transformer 314 for the switch cycle being performed (i.e., present switch cycle) and proceeds to operate the switches SW1-SW4 for the next switch cycle. For subsequent flux walk states (e.g., two or more occurrences), the power controller 218, as the corrective action, is configured to open the switches SW1-SW4 to shutoff power to the transformer 314 and may further notify the primary system controller 106 of the voltage build up.

As provided above, the power controller 218 is configured to inhibit a surge or drop in power to the heater 102 based on data from the power source sensor 212 and/or the rectified power sensor 214. For example, in one form, the power controller 218 is configured to open the switches SW1-SW4 to shutoff power to the transformer 314 in response to the input voltage exceeding one or more thresholds (e.g., input voltage is greater than a first threshold or input voltage is less than a second threshold). The threshold may be based on operation parameters of the thermal system. The power controller 218 may also send a notification to the primary system controller regarding the change in line power. A similar control can be performed based on data from the rectified power sensor 214.

While the heater 102 of FIG. 1 is illustrated as having one resistive heating element 110, the heater 102 may include one or more resistive heating elements and the power converter system 108 may include one or more isolated power converters 114 for providing power to the resistive heating elements. For example, referring to FIG. 5, a heater 502 is controlled by a control system 504 having a primary system controller 506 and a power converter system 508. The heater 502 includes multiple resistive heating elements 510-1 to 510-N (collectively "resistive heating element 510") that define multiple heating zones. The power converter system 508 includes one or more isolated power converters 514-1 to 514-N (isolated power converters 514) that provide power to the resistive heating elements 510. Each zone may be independently controlled and connected to a dedicated isolated power converter. Each of the isolated power converters 514 may be configured in a similar manner as the isolated power converter 114. Power source 516 may be configured in a similar manner as the power source 112.

The control system includes an isolated power converter of the present disclosure to provide an adjustable isolated power to the heater. The isolated power converter uses high speed switches to adjust the input voltage to a desired output voltage. The isolated power converter also performs a power conversion in which the heater is driven no more than the minimum available line voltage and the input current is substantially equal to the power delivered divided by the actual line voltage. Thus, a peak current drawn from the line is at minimum line voltage.

Power conversion may reduce the applied voltage to the heater at any given power level and reduce harmonics, and thus, further reduce leakage current. Whereas, phase angle control can add high frequency harmonics to the heater, which can increase leakage current. In addition, the isolated power converter inherently has power factor correction, and thus, may not need additional circuitry for correcting the power factor. That is, the electric current is drawn from the line power in phase with the isolated output voltage. The isolated power converter may further not need a large bulk capacitor (i.e., DC link capacitors) for storing energy, such as those found in variable DC power supplies.

In this application, the term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A power converter system for providing adjustable power to a heater, the power converter system comprising:
   an input rectifier configured to rectify a line power having a line energy;
   a full-bridge isolating converter comprising a full-bridge rectifier, wherein the full-bridge isolating converter is configured to generate an isolated output voltage based on the rectified line power, wherein the isolated output voltage is electrically isolated from the line energy; and
   a power controller configured to operate the full-bridge rectifier to generate the isolated output voltage, wherein:
   the power controller is configured to perform a variable frequency control to generate an output voltage that is less than or equal to a voltage limited power setpoint as the isolated output voltage; and
   the variable frequency control comprises reducing a switching frequency of the full-bridge rectifier from a standard frequency to a first frequency, reducing a pulse period of the full-bridge rectifier when the switching frequency is equal to the first frequency, and reducing the switching frequency from the first frequency to a second frequency when the pulse period is reduced.

2. The power converter system of claim 1, wherein the full-bridge isolating converter further comprises:
   a transformer electrically coupled to the full-bridge rectifier, wherein the transformer is configured to generate an isolated full-wave voltage; and
   an output rectifier configured to rectify the isolated full-wave voltage to generate the isolated output voltage.

3. The power converter system of claim 1, wherein the full-bridge rectifier includes a first pair of electronic switches and a second pair of electronic switches to drive the transformer with the rectified line power.

4. The power converter system of claim 2 further comprising a bridge sensor configured to detect an electric current through a primary winding of the transformer to detect flux walk.

5. The power converter system of claim 1 further comprising a filter configured to filter the isolated output voltage to output a desired output voltage.

6. The power converter system of claim 1, wherein the input rectifier is configured to receive, as the line power, one of a single-phase alternating current (AC) or a direct current (DC).

7. A control system comprising:
   the power converter system of claim 1; and
   a primary system controller configured to determine a desired output voltage and control the power converter system to generate the desired output voltage.

8. A method of converting power to operate a load being supplied by line power having a line energy comprising:
   rectifying the line power; and
   switchably driving a transformer with the rectified line power to generate an adjustable electrically isolated full-wave voltage;
   rectifying the electrically isolated full-wave voltage to obtain an isolated output voltage that is indicative of a desired output voltage applied to the load, wherein current is drawn from the line power in phase with the isolated output voltage; and
   performing a variable frequency control when the desired output voltage is less than a voltage limited power setpoint to drive the transformer at a switching frequency less than that of when the desired output voltage is greater than the voltage limited power setpoint, wherein the variable frequency control includes reducing a switching frequency from a standard frequency to a first frequency, reducing a pulse period when the switching frequency is equal to the first frequency, and reducing the switching frequency from the first frequency to a second frequency when the pulse period is reduced.

9. The method of claim 8 further comprising filtering the isolated output voltage to obtain the desired output voltage.

10. The method of claim 8 further comprising:
detecting an electric current through a primary winding of the transformer; and
performing a corrective action when the electric current is greater than a flux current threshold.

11. The method of claim 8 further comprising:
detecting an applied voltage, wherein the applied voltage is at least one of the line power or the rectified line power; and
performing a corrective action when the applied voltage exceeds a predefined voltage range.

12. The method of claim 8, wherein the line power is one of a single-phase alternating current (AC) or a direct current (DC).

13. The method of claim 8, wherein switchably driving the transformer further comprises alternatingly driving a first pair of electronic switches and a second pair of electronic switches, wherein the first pair of electronic switches and the second pair of electronic switches form a full-bridge rectifier.

14. A power converter system for providing a desired output voltage to a heater, the power converter system comprising:
an input rectifier configured to rectify a line power having a line energy;
a transformer configured to generate an isolated full-wave voltage;
a full-bridge rectifier electrically coupled to the transformer and operable to drive the transformer to generate the isolated full-wave voltage based on the rectified line power;
an output rectifier configured to rectify the isolated full-wave voltage to generate an isolated output voltage indicative of the desired output voltage;
a bridge sensor configured to measure a bridge current flowing through the transformer; and
a power controller configured to operate the full-bridge rectifier to drive the transformer, wherein:
the power controller is configured to perform a variable frequency control to generate an output voltage that is less than or equal to a voltage limited power setpoint as the isolated output voltage; and
the variable frequency control comprises reducing a switching frequency of the full-bridge rectifier from a standard frequency to a first frequency, reducing a pulse period of the full-bridge rectifier when the switching frequency is equal to the first frequency, and reducing the switching frequency from the first frequency to a second frequency when the pulse period is reduced.

15. The power converter system of claim 14, wherein the power controller is configured to determine a flux walk state in response to the bridge current being greater than or equal to a flux current threshold, and the power controller is configured to perform a corrective action in response to the flux walk state.

16. The power converter system of claim 14 further comprising a filter configured to filter the isolated output voltage to output the desired output voltage.

17. The power converter system of claim 14, wherein the input rectifier is configured to receive, as the line power, one of a single-phase alternating current (AC) or a direct current (DC).

* * * * *